United States Patent [19]

Ogasawara et al.

[11] Patent Number: 4,651,037
[45] Date of Patent: Mar. 17, 1987

[54] PRECISION ANALOG SWITCHING CIRCUIT EMPLOYING MOS TRANSISTORS

[75] Inventors: Kazuo Ogasawara; Yoshiichi Katoh; Hideo Takahashi, all of Tokyo, Japan

[73] Assignee: NEC Corporation, Tokyo, Japan

[21] Appl. No.: 501,858

[22] Filed: Jun. 7, 1983

[51] Int. Cl.[4] .................. H03K 17/16; H03K 17/693; H03K 19/096

[52] U.S. Cl. .................... 307/572; 307/577; 307/443; 307/579; 307/584; 307/585

[58] Field of Search ............. 307/352, 353, 571, 572, 307/584, 585, 575–579, 583, 443; 328/151

[56] References Cited

U.S. PATENT DOCUMENTS

| 4,198,580 | 4/1980 | Culmer | 307/577 |
| 4,393,318 | 7/1983 | Takahashi et al. | 307/353 |
| 4,467,227 | 8/1984 | Lewyn et al. | 307/579 |
| 4,511,814 | 4/1985 | Matsuo et al. | 307/572 |

Primary Examiner—Stanley D. Miller
Assistant Examiner—Timothy P. Callahan
Attorney, Agent, or Firm—Burns, Doane, Swecker & Mathis

[57] ABSTRACT

An insulated-gate type field-effect transistor (MOST) analog switching circuit which has improved capacitance compensation to provide high speed, low transient noise operation and which is readily implemented as an integrated circuit comprises a switching MOST coupled between an analog signal input terminal and an output terminal, and two series connected compensation MOSTs which are substantially the same size as the switching MOST. The compensation MOSTs are connected so as to function as compensation capacitors and the series circuit is connected between the output terminal of the switching circuit and a source of pulses of opposite phase to the switching pulses applied to the gate of the switching MOST. The compensation MOSTs can be interconnected in different ways to form the series circuit, but gate-to-gate interconnection is preferred where the junction capacitance between the source-drain and substrate is not negligible with respect to the gate capacitance. Capacitor operation of the compensation MOSTs can be achieved by short-circuiting the source and drain of each MOST together, or by connecting the source and drain, respectively, of each MOST to the source or drain of other MOST.

6 Claims, 12 Drawing Figures

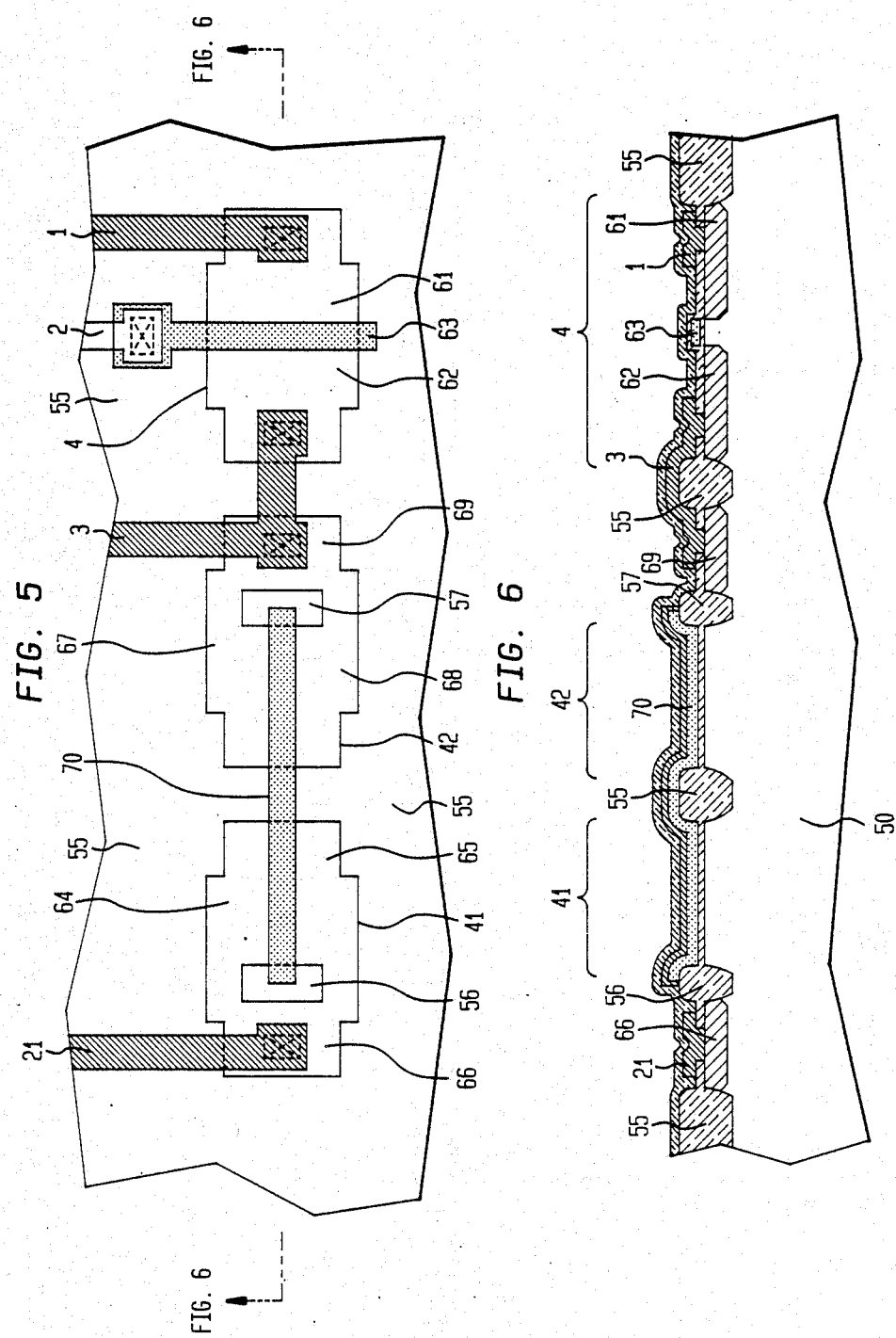

PRECISION ANALOG SWITCHING CIRCUIT EMPLOYING MOS TRANSISTORS

BACKGROUND OF THE INVENTION

1. Field of the Invention

This invention relates to an analog switching circuit, and more particularly to an analog switching circuit using an insulated-gate type field-effect transistor (referred to hereunder as MOST).

2. Description of the Prior Art

Analog switching circuits are widely used in various fields of applications such as an analog multiplexer, a sample and held circuit (referred to hereunder as S/H circuit), and a switched capacitor filter. Since frequency band and dynamic range of the signals treated by the application circuits have been expanded, a high-speed operation, low noise and high precision are required for the analog switches. Further, the above-mentioned application circuits are usually formed as integrated circuits (referred to hereunder as IC), so that the analog switches are required to be readily formed as a part of IC. The analog switch usually employs a transfer gate consisting of MOST as a switching means. More specifically, one and the other of source and drain of the MOST are used as input and output terminals of analog signals, respectively, and switching pulses are applied to the gate of the MOST thereby to close or open the MOST for carrying out switching for the analog signals. Since such analog switch inevitably has a stray capacitance between the source-drain and the gate of the switching MOST, a switching time includes a delay and the transient noise is generated at the output terminal on switching operation.

In order to cancel the transient noise at the output terminal, a capacitor is connected to the output terminal at its one terminal and pulses in opposite phase with respect to the phase of the switching pulses are applied to the other terminal of the capacitor. Usually, the compensation capacitor comprises a MOST having half the size of the switching MOST. The capacitance between source-drain and gate of the compensation MOST is utilized to cancel the transient noise at the output terminal. However, it is difficult in usual IC-manufacturing processes to control precisely the size ratio between transistors having considerably different sizes, so that, when the analog switching circuit with the compensation MOST is integrated into IC, the transient noise can not be completely cancelled, with the result of decreased precision of signals. In addition, the switching MOST taken an undesirably large size to increase the switching time and narrow the frequency band which can be treated.

It is therefore the object of this invention to provide an analog switching circuit which can operate with a high speed and little transient noise and can be easily formed in an IC.

SUMMARY OF THE INVENTION

The above object is accomplished in accordance with the present invention which provides the analog switching circuit comprising a switching MOST coupled between an input terminal of analog signals and an output terminal, the switching pulses being applied to its gate, and two compensation MOSTs each having substantially the same size as the switching MOST. The source and drain of each of the compensation MOSTs are short-circuited to form an effective compensation capacitor with the gate as one terminal and the short-circuited source-drain of the MOST as the other terminal. The two effective compensation capacitors are connected in series, one terminal of this series connection being connected to the output terminal of the switching circuit, while pulses with opposite phase with respect to switching pulses are applied to the other terminal. Within the series connection of the two compensation capacitors, the interconnection of the two capacitors is optional. Thus, the one terminals (gates) of the capacitors may be connected or the other terminals (source-drain) of the capacitors may be connected. Instead, the one terminal of one capacitor and the other terminal of the other capacitor may be connected. In the case where the junction capacitance between source-drain and substrate is not negligeable with respect to the gate capacitance, the one terminals (gates) of the capacitors are favorably connected. Where there is no problem of junction capacitance and the other terminals of the effective capacitors are to be connected, the source and drain of the one compensation MOST and those of the other compensation MOST are not necessarily short-circuited, respectively, but the source of the one compensation MOST may be connected to the source or drain of the other compensation MOST, and the drain of the one compensation MOST may be connected to the drain or source of the other compensation MOST.

The present invention can be realized by use of not only single-channel type MOSTs, i.e. N-channel type MOSTs (referred to hereunder NMOST) or P-channel type MOSTs (referred to hereunder PMOST) but also the complementary MOSTs (referred to hereunder CMOST).

In the case where CMOSTs are employed to form an analog switching circuit, the analog switching circuit may be comprised of first to third NMOSTs first to third PMOSTs having the same size. The respective current paths of the first NMOST and the first PMOST are connected in parallel between the analog signal input terminal and the output terminal. The respective gate - short-circuited drain/source paths of the second and third NMOSTs are connected in series between the output terminal and the gate of the first PMOST and the respective gate-short-circuited drain/source paths of the second and third PMOSTs are connected in series between the output terminal and the gate of the first NMOST.

According to the invention, the MOSTs having substantially the same size are used, and therefore, the size precision of elements can be readily increased. Further, half the value of stray capacitance of the switching MOST is obtained by connecting in series the two compensation MOSTs, so that the MOSTs having the smallest size can be formed through usual processes. Therefore, the stray capacitance of the switching MOST does not increase undesirably, which makes possible a high-speed switching. In addition, since the capacitance of the compensation MOST becomes small, driving of this capacitance becomes very easy.

These features show more remarkable effects in the case of CMOST. More specifically, an analog switching circuit using single channel type MOST can hold its linearity only to analog signals having amplitudes below the value of the amplitude in voltage of the switching signal applied to the gate of the switching MOST minus gate-source voltage of the switching MOST, whilst, in the case of CMOST, any one of two MOSTs holds its ON state even when analog signals having the same amplitudes as those of switching pulse voltage are applied, so that the linearity of the analog switching circuit is assured up to the amplitude of switching pulse voltage. Therefore, a very small size of transistor can be used for CMOST for switching use.

According to the prior art, the compensation MOST has been fabricated in a unit size while the switching MOST has been fabricated in a larger size which is twice the unit size. Thus, the capacitance between the gate -drain or -source of the switching MOST has been compensated by both the gate-drain capacitance and the gate-source capcitance of the compensation MOST. Accordingly, the size of the switching MOST has been inevitably large. This causes an unfavorable increase in the capacitance associated with the output terminal. On the contrary, according to the invention, since the compensation MOSTs and the switching MOST have the same size, the latter can have half the size heretofore used. This results in an analog switching integrated circuit for high-speed switching use.

The foregoing and other objects, features and advantages of the invention will be apparent from the following more particular description of preferred embodiments of the invention as illustrated in the accompanying drawings.

BRIEF DESCRIPTION OF THE DRAWINGS

FIG. 5 is a plan view of IC corresponding to the analog switching circuit of FIG. 4;

FIG. 6 is cross-sectional view of IC shown in FIG. 5 taken along the line V - W;

DETAILED DESCRIPTION OF THE PRIOR ARTS

Figure 1:
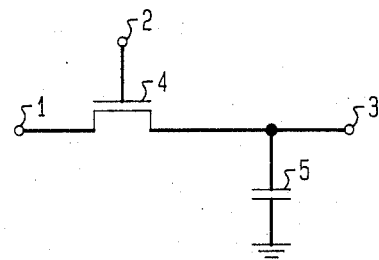
FIG. 1 is a schematic diagram of a prior art analog switch circuit.

An analog signal is applied to an analog input terminal 1 in FIG. 1. A MOS transistor 4 is used as analog switch, and a control signal terminal 2 is connected to the gate electrode of this MOS transistor 4. If this transistor 4 is of N type, it becomes conductive by applying a positive voltage to the terminal 2. At this time, an analog signal applied through the input terminal 1 carries out charge/discharge of a hold capacitor 5. The MOS transistor 4 becomes non-conductive when a negative voltage is applied to the control signal terminal 2. The analog voltage is held by the hold capacitor 5 and derived as an output signal from an output terminal 3.

In the circuit as shown in FIG. 1, the stray capacitance existing between the gate electrode and the source or drain electrode of the MOS transistor 4 causes a transient noise due to capacitance connection when the control signal changes from positive to negative.

Figure 2:
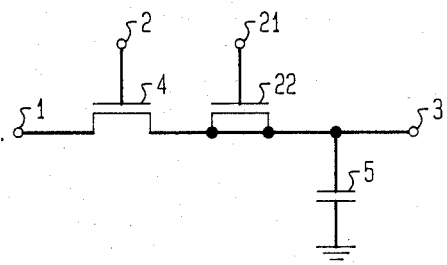
FIG. 2 is a schematic diagram showing the circuit of FIG. 1 provided with MOST for compensation use according to the prior art.

In order to cancel this transient noise, a circuit as shown in FIG. 2 was employed, in which a MOS transistor 22 for compensation is connected to the output terminal 3 and a compensation signal terminal 21 connected to the gate of MOST 22 is driven in the opposite phase with respect to the control signal terminal 2. The opposite phase signal can be readily generated by inverting the signal applied to the control signal terminal 2 by an inverter. In the circuit shown in FIG. 2, when the control signal changes from positive to negative, the compensation signal changes from negative to positive, so that a transient noise caused by the stray capacitance of MOS transistor 4 is cancelled by MOS transistor 22.

Noise is cancelled by decreasing the size of MOS transistor 22 for compensation to the half of that of the switching MOS transistor 4. Thus, the switching MOST 4 and the compensation MOST 22 are manufactured with the size ratio of 2:1, but it is difficult to precisely maintain this size ratio in the usual IC manufacturing process. Namely, the coupling capacitance between the terminals 2 and 3 is provided by the capacitance between the gate and either the drain or source of the transistor 4 that is connected to the output terminal 3, which is half of the whole gate-drain and source capacitance of the transistor 4. Therefore, in the case where the MOS capacitor formed by the transistor 22 having the short-circuited drain and source is employed to cancel this coupling capacitance, the size of the transistor 22 is one half of the size of the switching transistor 4. In other words, the MOS capacitor formed by the transistor 22 utilizes both the gate-drain capacitance and the gate-source capacitance of the transistor 22. Therefore, the half-sized transistor 22 provides the same capacitance as the above coupling capacitance. This error in the size ratio deteriorates the cancelling property of transient noise, which results in an offset voltage caused in, e.g., a S/H circuit using this analog switching circuit, thereby decreasing the precision thereof. Further, since the switching MOST 4 must be made twice the size of the MOST 22, the size of the switching MOST 4 becomes at least twice the size of the smallest element in IC. Accordingly, an element having a larger size than that needed for switching operation of the switching MOST 4 is used in IC, so that the stray capacitance of this switching MOST 4 is undesirably increased, bringing about such difficulties as decrease in switching speed of the element.

Figure 3:
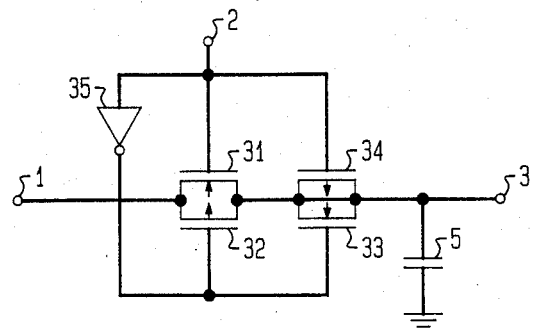
FIG. 3 is a schematic diagram of a prior art CMOST analog switch circuit.

The same problems are encountered in the analog switching circuit using CMOST as shown in FIG. 3. In this figure, NMOST 31 and PMOST 32 are used as CMOST analog switches respectively, and NMOST 33 for compensation use having half the size of NMOST 31 for switching use and PMOST 34 for compensation use having half the size of PMOST 32 for switching use respectively are connected to the output terminal 3. When a control signal applied to the control signal terminal 2 changes from positive to negative, the gate potential of the switching NMOST 31 changes from positive to negative, while the gate potential of the switching PMOST 32 changes from negative to positive respectively, thereby to cause a transient noise at the analog signal paths. This noise is cancelled by compensation NMOST 33 and PMOST 34. However, since the size ratio between MOSTs for switching use and MOSTs for compensation use is not precisely held, the residue of noise is generated and this residue becomes the offset voltage of a S/H circuit.

DETAILED DESCRIPTION OF PREFERRED EMBODIMENTS

Figure 4:
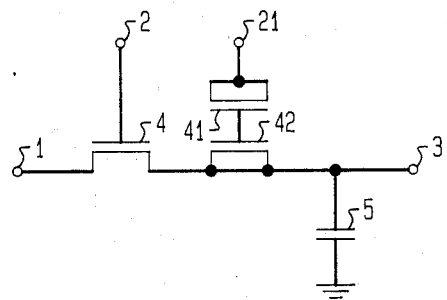
FIG. 4 is a schematic diagram of an analog switching circuit using NMOST according to the first embodiment of the invention.

The disadvantages of the analog switching circuit shown in FIG. 2 is dissolved by the circuit structure as shown in FIG. 4. In the FIG. 4, a series connection of two effective capacitors comprized respectively of NMOST 41 and NMOST 42 is used for compensation use. In accordance with such structure, NMOST 4 for switching use can be made with substantially the same size as NMOSTs 41, 42 for compensation use, so that even if any variation of sizes is caused in the manufacturing process, that variation is generated substantially uniformly to respective MOSTs. Accordingly, the capacitance ratio between the switching MOST and the compensation MOSTs is maintained at 2:1. Referring now to FIG. 5 and FIG. 6 which show IC structure realizing the circuit of FIG. 4, NMOSTs 4, 41, 42 are formed on a P type substrate 50, surrounded each by field insulator 55. The switching NMOST 4 has a polysilicon gate 63, to which a switching signal is applied via the control line 2. An input signal line 1 is connected to the drain or source 61 of NMOST 4 and an output signal line 3 is connected to its source or drain 62, NMOSTs 41, 42 for compensation use have respective gates connected in common and formed of a polysilicon layer 70. The N-type source 64 and the N-type drain 65 of NMOST 41 are formed by diffusion together with an N-type contact region 66 which short-circuits the regions 64 and 65. This contact region 66 is connected to a compensation signal line 21. In the same manner, the N-type source 67 and the N-type drain 68 of NMOST 42 are formed by diffusion together with the N-type contact region 69, and this contact region 69 is connected to the output signal line 3. Field insulators 56 and 57 are provided as islands in NMOST 41 and 42, respectively, so that gate widths of respective MOSTs are determined by these island-like field insulator 56, 57 and the surrounding field insulator 55. These gate widths are substantially the same as the gate width of the NMOST 4. Consequently, even if field insulators encroaching upon the element regions are formed as a result of variation of manufacturing process, this variation occurs similarly to all NMOSTs, so that the size ratio between MOST for switching use and MOSTs for compensation use is held constant.

Further, in this embodiment of the invention, the source 64 and the drain 65 of NMOST 41 are connected to the compensation signal line 21, and the respective gates 70 of NMOST 41, 42 are connected with each other, so that there is almost no undesirable coupling between the connection point of NMOST 41, 42 and the P type substrate 50. Consequently, the compensated output signal can be applied effectively to the output terminal 3.

Figure 7:
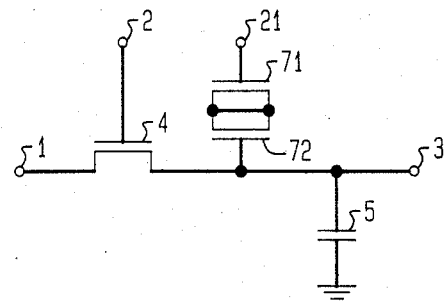
FIG. 7 is a schematic diagram of an analog switching circuit using NMOST according to the second embodiment of the invention.

In the second embodiment of the invention shown in FIG. 7, the source and the drain of a compensation NMOST 71 and the source and the drain of a compensation NMOST 72 are all common-connected and the gates of MOST 71 and MOST 72 are connected to the compensation signal terminal 21 and the output terminal 3, respectively, to form a series connection of two effective capacitors. This provides a compensation structure of a smaller size.

Figure 8:
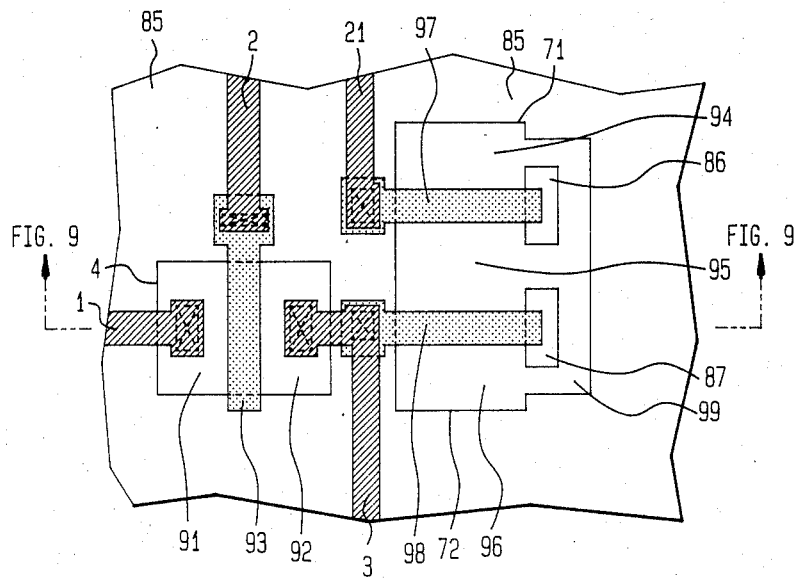
FIG. 8 is a plan view of IC corresponding to the analog switching circuit of FIG. 7.
Figure 9:
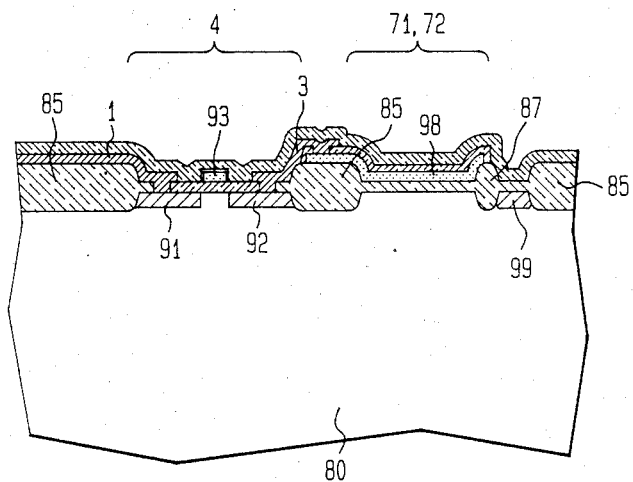
FIG. 9 is a cross-sectional view of FIG. 8 taken along the line X - Y.

As shown in FIG. 8 and FIG. 9, two element regions surrounded each by a field insulator 85 are provided on a P type substrate 80, the switching MOST 4 being formed on one of the element regions, and MOSTs for compensation use 71, 72 being formed on the other element region. NMOST 4 is comprised of a polysilicon gate 93, an N-type drain 91 and N-type source 92. The polysilicon gate 93 is connected to a control signal line 2. By making this MOST 4 into ON-state by a control signal, signals from an analog signal input line 1 connected to the drain 91 can be transmitted to an output terminal 3 connected to the source 92. The two compensation NMOSTs 71, 72 have an N type drain region 94, a N-type common source-drain region 95, an N-type source region 96, an N-type short-circuitting region 99 connected in common to the former three regions 94, 95 and 96, a polysilicon gate 97 of MOST 71, and a polysilicon gate 98 of MOST 72. Thus, regions of source and drain of these two transistors 71 and 72 are limited to only three regions, i.e., drain region 94 of NMOST 71, common region 95, and source region 96 of NMOST 72, and these regions together with a wiring region 99 are formed by diffusion and are short-circuited with each other. Island-like field insulators 86, 87 determine respectively channel widths of NMOST 71 and NMOST 72.

In the structure as described above, the size of each MOST can be determined extremely precisely.

Figure 10:
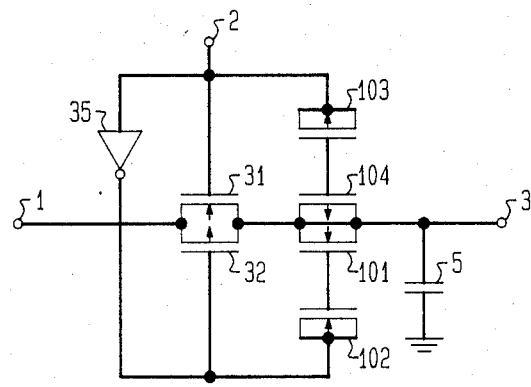
FIG. 10 is a schematic view of an analog switching circuit using CMOST according to the third embodiment of the invention.

Referring now to FIG. 10, the analog switching circuit of this CMOST comprises NMOST 31 and PMOST 32 for switching use between the input and output terminals 1 and 3 and NMOSTs 101, 102 and PMOSTs 103, 104 for compensation use. The compensation NMOSTs 101 and 102 are connected gate-to-gate, like those 41 and 42 in FIG. 4, between the gate of the switching PMOST 32 and the output terminal 3, and the other pair of the compensation PMOSTs 103 and 104 are connected also gate-to-gate between the gate of the switching NMOST 31 and the output terminal 3. The switching signal terminal 2 is connected to the gate of NMOST 31 and an inverter 35 is inserted between the gates of the switching MOSTs 31 and 32 to invert the switching signal at the gate of NMOST 31 for PMOST 32. In such structure of analog switching circuit using CMOSTs, CMOSTs for switching use can be the smallest element in the IC, so that the stray capacitance of switch can be decreased thereby to improve the switching speed. Further, this embodiment shows all the effects of the first embodiment described above.

Figure 11:
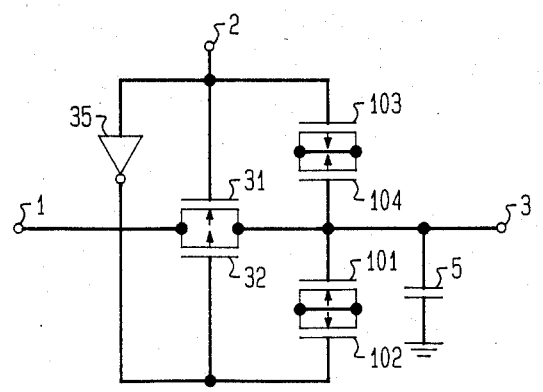
FIG. 11 is a schematic view of an analog switching circuit using CMOST according to the fourth embodiment of the invention.
Figure 12:
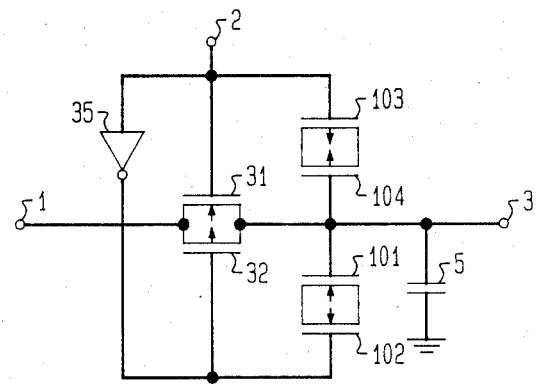
FIG. 12 is a schematic view of an analog switching circuit using CMOST according to the fifth embodiment of the invention.

With respect to the connection of MOSTs 101 to 104 for compensation use, all sources and drains of NMOST 101, 102 can be short-circuited with each other and connected in common, as well as all sources and drains of PMOST 103, 104, as shown by FIG. 11. Alternatively, as shown by FIG. 12, corresponding sources and drains of respective NMOST 101, 102 can be connected with each other, and corresponding sources and drains of respective PMOST 103, 104 can be connected with each other, i.e., these sources and drains are not short-circuited with each other.

What is claimed is:
1. An analog switching circuit comprising a first, a second and a third insulated-gate type field-effect tran- sistors having each substantially the same size, said first insulated-gate type field-effect transistor having a current path connected between an analog signal input terminal and an analog signal output terminal and the gate connected to a switching signal input terminal, the source and the drain of said second insulated-gate type field-effect transistors being respectively connected to the source and the drain of said third insulated-gate type field-effect transistor, the gate of said second insulated-gate type field-effect transistor being connected to said analog signal output terminal, and means for applying a signal having an opposite phase with respect to that to that of a signal at said switching signal input terminal to the gate of said third insulated-gate type field-effect transistor.

2. An analog switching circuit comprising a first, a second and a third N-channel insulated-gate type field-effect transistor, a first, a second and a third P-channel insulated-gate type field-effect transistors, said first to third N-channel insulated-gate field-effect transistors and said first to third P-channel insulated-gate type field-effect transistors having substantially the same size, a current path of said first N-channel insulated-gate type field-effect transistor and a current path of said first P-channel insulated-gate type field-effect transistor being connected in parallel between an analog signal input terminal and an analog signal output signal, said second N-channel insulated-gate type field-effect transistor and said second P-channel insulated-gate type field-effect transistor having their respective gates connected to said analog signal output terminal, said second N-channel insulated-gate tyoe field-effect transistor and said third N-channel insulated-gate type field-effect transistor having commonly connected sources and commonly connected drains, said second P-channel insulated-gate type field-effect transistor and said third P-channel insulated-gate type field-effect transistor having their respective sources connected in common and respective drains connected in common, means for applying a switching signal to the respective gates of said first N-channel insulated-gate type field-effect transistor and said third P-channel insulated-gate type field-effect transistor, and means for applying a signal having a phase opposite to said switching signal to the respective gates of said first P-channel insulated-gate type field-effect transistor and said third N-channel insulated-type field-effect transistor.

3. An analog switching circuit comprising first, second and third N-channel insulated-gate type field-effect transistors, first, second and third P-channel insulated-gate type field-effect transistors, said first to third N-channel insulated-gate field-effect transistors and said first to third P-channel insulated-gate type field effect transistors having substantially the same size, a current path of said first N-channel insulated-gate type field-effect transistor and a current path of said first P-channel insulated-gate type field-effect transistor being connected in parallel between an analog signal input terminal and an analog signal output terminal, said second N-channel insulated-gate type field-effect transistor and said second P-channel insulated-gate type field-effect transistor having their respective gates connected to said analog signal output terminal, said second N-channel insulated-gate type field-effect transistor and said third N-channel insulated-gate type field-effect transistor having commonly connected source and commonly connected drains, said second P-channel insulated-gate type field-effect transistor and said third P-channel insulated-gate type field-effect transistor having their respective sources connected in common and respective drains connected in common, said second N-channel insulated-gate type field-effect transistor and said third N-channel insulated-gate type field-effect transistor have all their sources and drains short-circuited, while said second P-channel insulated-gate type field-effect transistor and said third P-channel insulated gate type field-effect transistor have all their sources and drains short-circuited, means for applying a switching signal to the respective gates of said first N-channel insulated-gate type field-effect transistor and said third P-channel insulated-gate type field-effect transistor, and means for applying a signal having a phase opposite to said switching signal to the respective gates of said first P-channel insulated-gate type field-effect transistor and said third N-channel insulated-type field-effect transistor.

4. An analog switching circuit comprising an input terminal for an analog signal, an output terminal, a first insulated-gate type field-effect transistor of one conductivity type having a current path coupled between said input and terminals, means for applying a switching signal to the gate of said first insulated-gate type field-effect transistor, a second insulated-gate type field-effect transistor of the opposite conductivity type having substantially the same size as said first insulated-gate field-effect transistor, the source and the drain of said second insulated-gate field-effect transistor being short-circuited to form a first effective capacitor between the gate and the short-circuited source and drain thereof, a third insulated-gate field-effect transistor of said opposite conductivity type having substantially the same size as said first insulated-gate type field-effect transistor and a short-circuited source and drain to form a second effective capacitor between the gate and the short-circuited source and drain thereof, said short-circuited sources and drains of said second and third transistors being connected in common, the gate of said second transistor and the gate of said third transistor being connected to a first terminal and said output terminal, respectively, and means for applying a signal having the same phase as said switching signal to said first terminal.

5. An analog switching circuit comprising a first, a second and a third insulated-gate type field-effect transistors having each substantially the same size and each having a drain, a source and a gate, said first insulated-gate type field-effect transistor having a current path connected between an analog signal input terminal and an analog signal output terminal and the gate connected to a switching signal input terminal, the gate of said second insulated-gate type field-effect transistor and the gate of said third insulated-gate type field-effect transistor being commonly connected, the drain and source of said second insulated-gate type field-effect transistor being connected to said analog signal output terminal, and means for applying a singal having an opposite phase with respect to that of said switching signal to the drain and source of said thrd insulated-gate type field-effect transistor.

6. An analog switching circuit comprising a first, a second and a third N-channel insulated-gate type field-effect transistors, a first, a second and a third P-channel type insulated-gate type field-effect transistors, said first to third N-channel insulated-gate type field effect transistors and said first to third P-channel insulated-gate type field effect transistors having each substantially the same size, a current path of said first N-channel insulated-gate type field-effect transistor and a current path of said first P-channel insulated-gate type field-effect transistor being connected in parallel between an analog signal input terminal and an analog signal output terminal, the drain and source of said second N-channel insulated-gate type field-effect transistor and the drain and source of said second P-channel insulated-gate type field-effect transistor being connected to said analog signal output terminal, the gate of said second N-channel insulated-gate type field-effect transistor and the gate of said third N-channel insulated-gate type field-effect transistor being commonly connected, the gate of said second P-channel insulated-gate type field-effect transistor and the gate of said third P-channel insulated-gate type field-effect transistor being cnnected in common, means for applying a switching signal to the gate of said first N-channel insulated-gate type field-effect transistor and the drain and source of said third P-channel insulated gate type field-effect transistor, and means for applying a signal having a phase opposite to said switching signal to the gate of said first P-channel insulated-gate type field-effect transistor and the drain and source of said third N-channel insulated-type field-effect transistor.

* * * * *